United States Patent
Kawai et al.

(10) Patent No.: US 12,165,993 B2
(45) Date of Patent: Dec. 10, 2024

(54) SEMICONDUCTOR DEVICE

(71) Applicant: RENESAS ELECTRONICS CORPORATION, Tokyo (JP)

(72) Inventors: Tohru Kawai, Tokyo (JP); Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 860 days.

(21) Appl. No.: 17/108,298

(22) Filed: Dec. 1, 2020

(65) Prior Publication Data
US 2022/0173056 A1    Jun. 2, 2022

(51) Int. Cl.
*H01L 23/64*    (2006.01)
*H01F 27/00*    (2006.01)

(52) U.S. Cl.
CPC ......... *H01L 23/645* (2013.01); *H01F 27/006* (2013.01)

(58) Field of Classification Search
None
See application file for complete search history.

(56) References Cited

U.S. PATENT DOCUMENTS

| | | | |
|---|---|---|---|
| 2018/0166375 A1* | 6/2018 | Stecher | H01L 23/3171 |
| 2018/0308795 A1 | 10/2018 | Uchida et al. | |
| 2020/0343037 A1* | 10/2020 | Chen | H01F 27/363 |
| 2020/0381167 A1* | 12/2020 | Moriki | H01F 27/245 |

FOREIGN PATENT DOCUMENTS

JP    2018-182223 A    11/2018

* cited by examiner

Primary Examiner — Nilufa Rahim
(74) Attorney, Agent, or Firm — Rimon P.C.

(57) ABSTRACT

A semiconductor device has a semiconductor substrate, a first insulating layer, a first inductor, a second insulating layer, a second inductor, a pad and an annular wiring. The first insulating layer is formed on the semiconductor substrate. The first inductor is directly formed on the first insulating layer. The second insulating layer is formed on the first insulating layer such that the second insulating layer covers the first inductor. The second inductor is directly formed on the second insulating layer such that the second inductor faces the first inductor. The pad is directly formed on the second insulating layer. The pad is electrically connected with the second inductor. The annular wiring is electrically connected with the pad. The annular wiring is spaced apart from the second inductor. The annular wiring surrounds the second inductor without forming a vertex in plan view.

4 Claims, 16 Drawing Sheets

SEMICONDUCTOR DEVICE

BACKGROUND

The present disclosure relates to a semiconductor device, for example, to a semiconductor device including an inductor.

There is a disclosed technique listed below.
[Patent Document 1] Japanese Unexamined Patent Application Publication No. 2018-182223

A semiconductor device including a first inductor electrically connected with a semiconductor element for power, and a second inductor electrically connected with a semiconductor element for a MCU (microcomputer) is known (for example, see Patent Document 1). Here, a driving voltage of the semiconductor element for power is about several hundred volts. On the other hand, a driving voltage of the semiconductor element for MCU is about several volts. Therefore, the semiconductor element for the power, when the semiconductor element for the MCU is connected to each other, there is a possibility that the semiconductor element for the MCU is damaged.

In the semiconductor device disclosed in Patent Document 1, the first inductor and the second inductor face with each other through an interlayer insulating film. Thus, the semiconductor element for the power, and the semiconductor element for the MCU can transmit signals to each other by electromagnetic inductive coupling through the first inductor and second inductor. The semiconductor element for MCU is electrically insulated from the semiconductor element for power. Therefore, due to a difference between the driving voltage of the semiconductor element for power and the driving voltage of the semiconductor element for MCU, the semiconductor element for MCU is not damaged.

SUMMARY

However, in the semiconductor device disclosed in Patent Document 1, the first inductor electrically connected with the semiconductor device for power is formed of a spiral wiring having a spiral shape in a plan view. A shape of the first inductor is, in plan view, for example, substantially polygonal shape. The spiral wiring has a plurality of vertexes. The vertex is formed of two sides adjacent each other among a plurality of sides constituting an outer edge of the spiral wiring. An electric field tends to concentrate on the vertex because a part located in a vicinity of the vertex, of the spiral wiring, is angular toward outward in plan view. As a consequence, in the semiconductor device, abnormal discharge sometimes occurs the vertex as a starting point. More specifically, the abnormal discharge may occur between the vertex and a conductive film such as a guard ring and an electrode pad in which a different potential from a potential applied to the first inductor is supplied. That is to say, there is room for improving in the semiconductor device from the viewpoint of reliability.

It is a problem of the embodiment to improve the reliability of the semiconductor device. Other problems and novel features will become apparent from the description of the specification and drawings.

A semiconductor device according to embodiments includes a semiconductor substrate, a first insulating layer formed on the semiconductor substrate, a first inductor directly formed on the first insulating layer, a second insulating layer formed on the first insulating layer such that the second insulating layer covers the first inductor, a second inductor directly formed on the second insulating layer such that the second inductor faces the first inductor, a pad directly formed on the second insulating layer, the pad electrically connected with the second inductor, and an annular wiring electrically connected with the pad, the annular wiring spaced apart from the second inductor. In plan view, the annular wiring surrounds the second inductor without having a vertex.

According to the embodiments, it is possible to improve the reliability of the semiconductor device.

DETAILED DESCRIPTION

Figure 1:
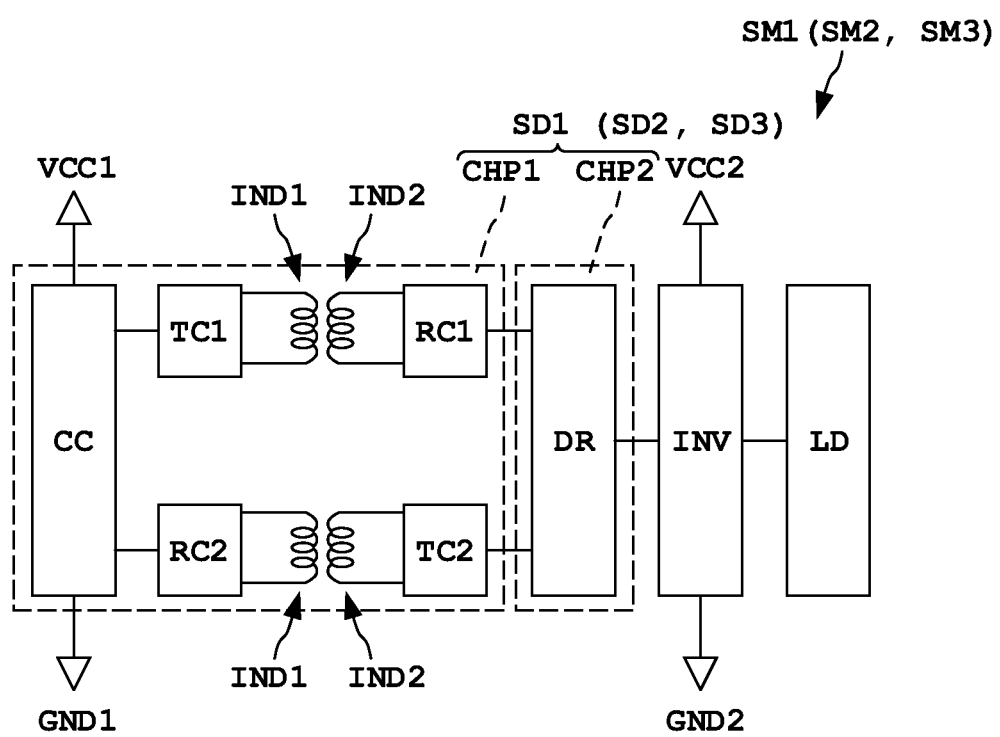
FIG. 1 is a block diagram showing an exemplary configuration of a semiconductor module according to a first embodiment to a third embodiment.

Hereinafter, a semiconductor device according to embodiments will be described in detail by referring to the drawings. In the specification and the drawings, the same or corresponding element are denoted by the same reference numerals, and a repetitive description thereof is omitted. In the drawings, for convenience of description, a configuration may be omitted or simplified. From the viewpoint of visibility, even a plan view may be hatched. In addition, a cross-sectional view may be shown as an end view.

First Embodiment

A semiconductor device SD1 according to a first embodiment, in plan view, has an annular wiring AWR surrounding a second inductor IND2.

(Configuration of Semiconductor Module)

FIG. 1 is a block diagram showing an exemplary configuration of the semiconductor module SM1 according to the first embodiment.

As shown in FIG. 1, the semiconductor module SM1 includes a semiconductor device SD1, an inverter INV, and a load LD. The semiconductor device SD 1 includes a first semiconductor chip CHP1 and a second semiconductor chip CHP2.

The first semiconductor chip CHP1 includes a control circuit CC, a first transmitting circuit TC1, a second transmitting circuit TC2, a first inductor IND1, a second inductor IND2, a first receiving circuit RC1 and a second receiving circuit RC2. The second semiconductor chip CHP2 includes a drive circuit DR.

The control circuit CC outputs a signal for controlling the drive circuit DR. The control circuit CC is input a signal from the drive circuit DR. The control circuit CC is electrically connected with the first transmitting circuit TC1 and the second receiving circuit RC2. The control circuit CC is configured to be supplied with a first power supply potential VCC1, and to be grounded to a first ground potential GND1. The first power supply potential VCC1 is, for example, about several volts.

The first transmitting circuit TC1 transmits a signal received from the control circuit CC toward the first receiving circuit RC1. The first transmitting circuit TC1 is electrically coupled with the first inductor IND1. The first transmitting circuit TC1 transmits a signal toward the first inductor IND1.

The first receiving circuit RC1 receives a signal from the first transmitting circuit TC1. The first receiving circuit RC1 is electrically coupled with the second inductor IND2. The first receiving circuit RC1 receives a signal from the first transmitting circuit TC1 by an e inductive coupling (magnetic coupling) between the first inductor IND1 and the second inductor IND2.

The second transmitting circuit TC1 transmits a signal received from the control circuit DR toward the second inductor IND2. The second transmitting circuit TC2 is electrically coupled with the second inductor IND2. The second transmitting circuit TC1 transmits a signal toward the second inductor IND2.

The second receiving circuit RC2 receives a signal from the first transmitting circuit TC1. The second receiving circuit RC2 is electrically coupled with the first inductor IND1. The second transmitting circuit TC2 receives a signal from the transmitting circuit IND2 by inductive coupling (magnetic coupling) between the first inductor IND1 and the second inductor IND2.

The drive circuit DR transmits a signal for driving the inverter INV toward the inverter INV based on a signal from the control circuit CC. The drive circuit DR is electrically coupled with the inverter INV. The drive circuit DR is configured to be supplied with a second power supply potential VCC2, and to be grounded to a second ground potential GND2. The second power supply potential VCC2 is greater than the first power supply potential VCC1. The second power supply potential VCC2 is, for example, about several hundred volts. A potential difference between the second power supply potential VCC2 and the first power supply potential VCC1 is, for example, 800 V or more.

The inverter INV controls the load LD. The inverter INV is electrically coupled with the load LD. The load LD is, for example, a motor.

Note that a configuration of the first semiconductor chip CHP1, a configuration of the second semiconductor chip CHP2 are not particularly limited. For example, the second semiconductor chip CHP2 may include the first transmission circuit TC1, the second transmitting circuit TC2, the first inductor IND1, the second inductor IND2, the first receiving circuit RC1 and the second receiving circuit RC2.

In the semiconductor module SM1, the transmission and reception of the signal is performed through the first inductor IND1 and the second inductor IND2. Thus, in a state where the control circuit CC driven at a low voltage and the drive circuit DR driven at a high voltage are electrically isolated from each other, transmission and reception of the signal is performed. As a result, it is possible to prevent damage to the control circuit CC due to a voltage difference between the drive voltage of the control circuit CC and the drive voltage of the drive circuit DR.

(Configuration of Semiconductor Device)

Figure 2:
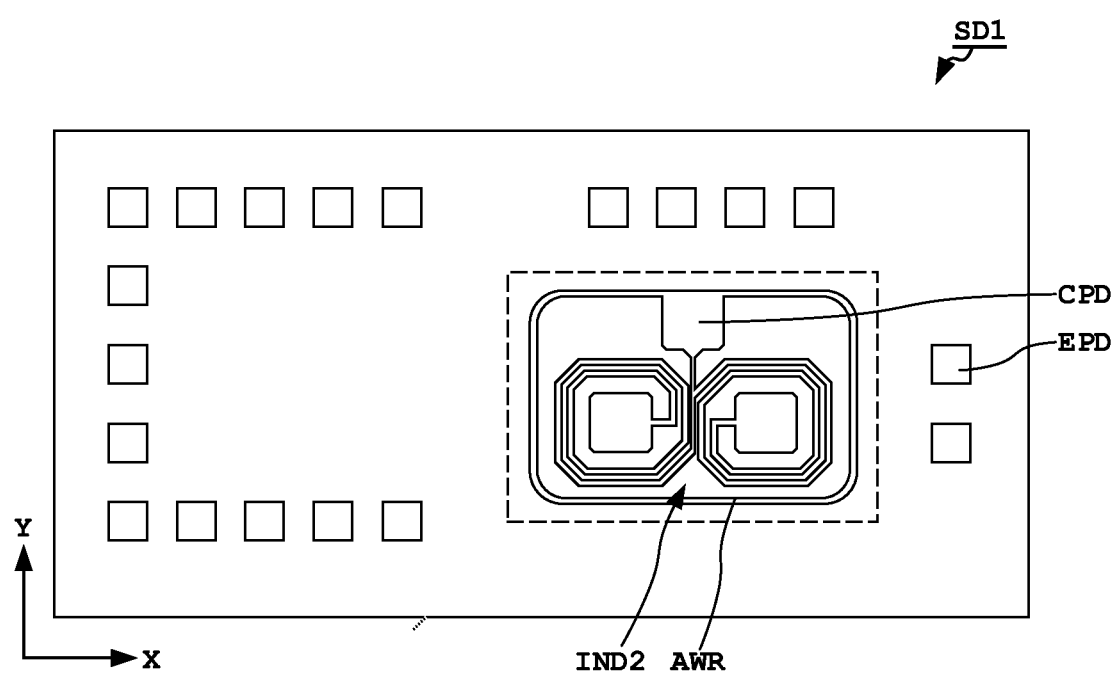
FIG. 2 is a plan view illustrating an exemplary configuration of a main portion of a semiconductor device according to the first embodiment.
Figure 3:
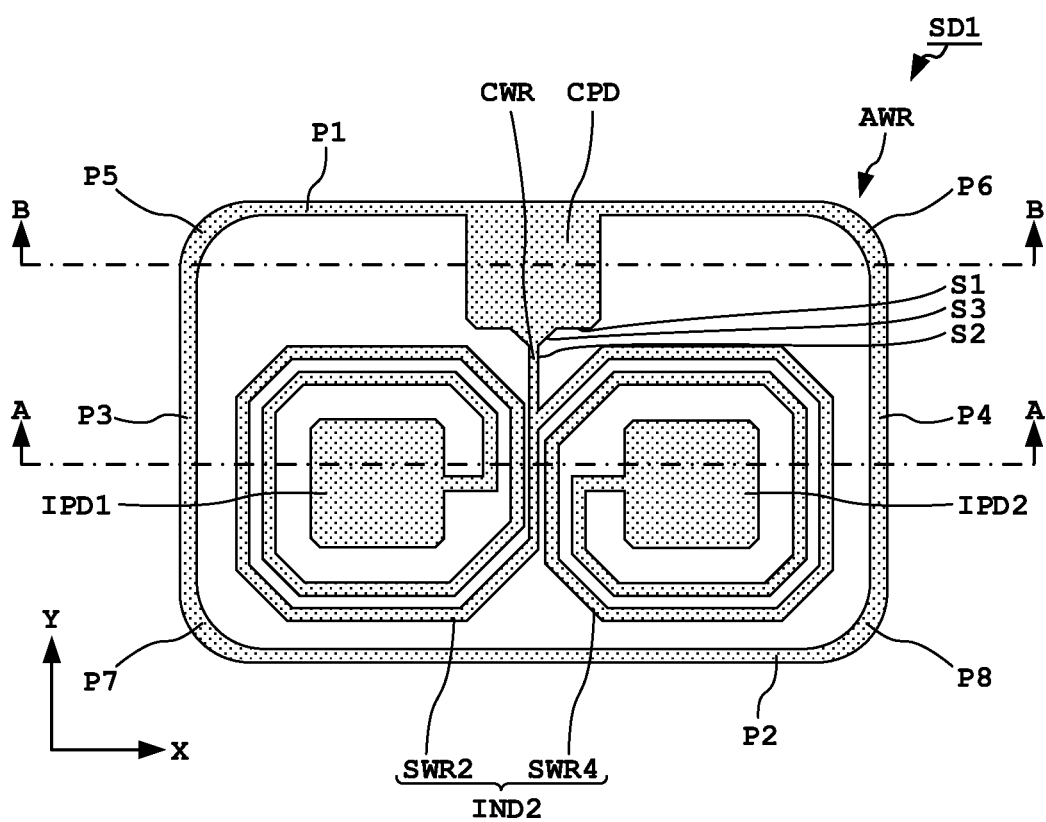
FIG. 3 is a partially enlarged plan view illustrating an exemplary configuration of the main portion of the semiconductor device according to the first embodiment.
Figure 4:
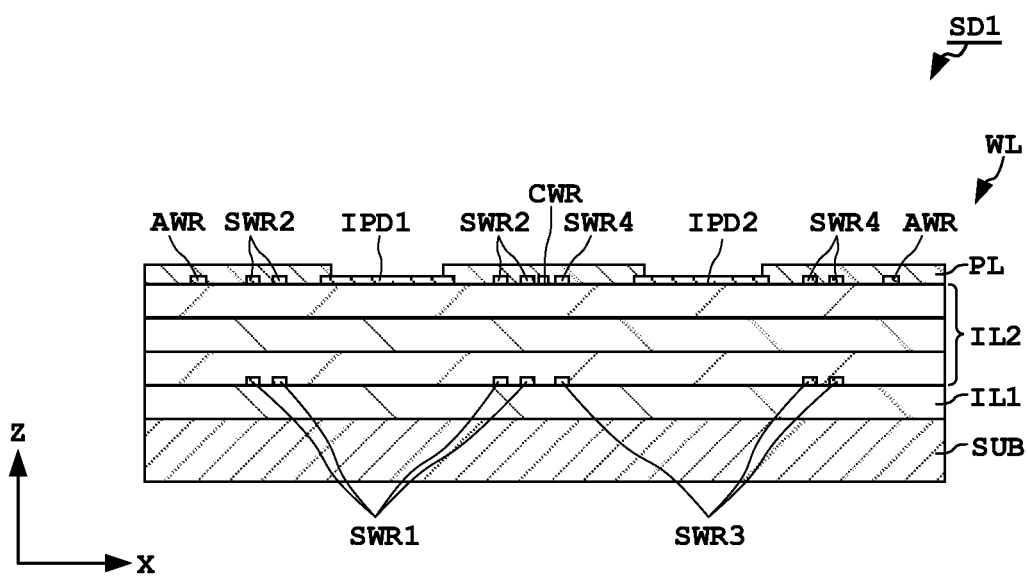
FIG. 4 is a cross-sectional view illustrating an exemplary configuration of the main portion of the semiconductor device according to the first embodiment.
Figure 5:
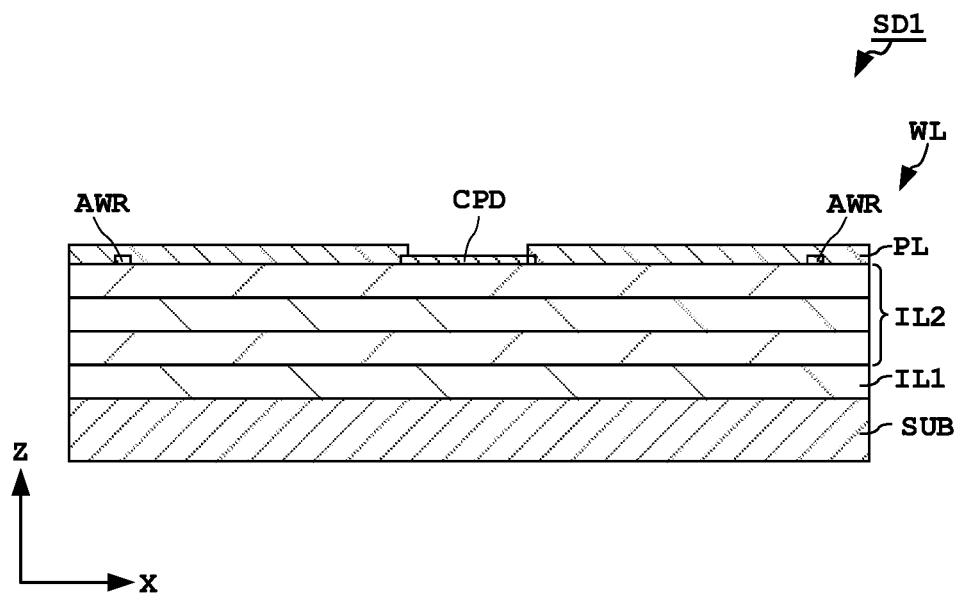
FIG. 5 is a cross-sectional view illustrating an exemplary configuration of the main portion of the semiconductor device according to the first embodiment.

FIG. 2 is a plan view illustrating an exemplary configuration of a main portion of the semiconductor device SD1 according to the first embodiment. FIG. 3 is a partially enlarged plan view illustrating an exemplary configuration of the main portion of the semiconductor device SD1. FIG. 3 is a plan view illustrating an area surrounded by a broken line in FIG. 2. FIGS. 4 and 5 are cross-sectional view illustrating an exemplary configuration of the main portion of the semiconductor device SD1. FIG. 4 is a cross-sectional view taken along line A-A of FIG. 3. FIG. 5 is a cross-sectional view taken along line B-B of FIG. 3.

X, Y and Z directions shown in FIGS. 2-5 are as follows. The X direction is a direction from one to the other of a second spiral wiring SWR2 and a fourth spiral wiring SWR4. In present embodiment, the X direction is the direction from the second spiral wiring SWR2 to the fourth spiral wiring SWR4. The X direction is the direction along a long side of a semiconductor substrate SUB. The X direction is along a main surface (a first surface SF1) of the semiconductor substrate SUB. The Y direction, in plan view, is a direction perpendicular to the X direction. The Y direction is along the first surface SF1 of the semiconductor substrate SUB. The Z direction is a direction from one toward the other of the first inductor IND1 and the second inductor IND2. The Z direction is a thickness direction of a second insulating layer IL2. The X direction, the Y direction, and the Z direction are orthogonal with each other.

The semiconductor device SD 1 includes a semiconductor substrate SUB, a first insulating layer IL1, a first inductor IND1, a second insulating layer IL2, a second inductor IND2, a connecting wiring CWR, a center pad CPD, a first inner pad IPD1, a second inner pad IPD2, a annular wiring AWR, an electrode pad EPD, and a protective layer PL.

The first insulating layer IL1, the first inductor IND1, the second insulating layer IL 2, the second inductor IND2, the connecting wiring CWR, the center pad CPD, the first inner pad IPD1, the second inner pad IPD2, the annular wiring AWR, and the electrode pad EPD constitute a wiring layer WL. The wiring layer WL is formed on the semiconductor substrate SUB. The wiring layer WL is formed of two or more wiring layers. The wiring layer WL is a layer including an insulating layer and one or both of a wiring and a via (also referred to as "plug") formed in the insulating layer. Here, the wiring is a conductive member for transmitting an electrical signal.

The semiconductor substrate SUB supports the wiring layer WL and the protective layer PL. Although not shown, a semiconductor element is formed on the main surface of semiconductor substrate SUB. The semiconductor element is, for example, a transistor. The semiconductor element may be included in the control circuit CC, the first transmitting circuit TC1, the first receiving circuit RC1, the second transmitting circuit TC2, or the second receiving circuit RC2. A material of the semiconductor substrate SUB is, for example, monocrystalline silicon (Si).

The first insulating layer IL1 is formed on the semiconductor substrate SUB. A thickness of the first insulating layer IL1 is, for example, 1 μm or more and 3 μm or less. The material of the first insulating layer IL1 is, for example, silicon oxide.

The first inductor IND1 is directly formed on the first insulating layer ILL The first inductor IND1 is electrically connected with the control circuit CC to be driven at a low voltage. The first inductor IND1 includes a first spiral wiring SWR1 and a third spiral wiring SWR3 electrically connected with each other.

An end part of the first spiral wiring SWR1 is electrically connected with an end part of the third spiral wiring SWR3. In present embodiment, the first spiral wiring SWR1 and the third spiral wiring SWR3 are integrally formed with each other as a single member. The first spiral wiring SWR1 and the third spiral wiring SWR3 are formed such that each of the first spiral wiring SWR1 and the third spiral wiring SWR3 are spirally wound in plan view. In plan view, a winding direction of the first spiral wiring SWR1 is opposite to a winding direction of the third spiral wiring SWR3. Thus, the first inductor IND1 can be operated by differential operation. The first spiral wiring SWR1 and the third spiral wiring SWR3 are aligned in the X direction.

A shape of each of the first spiral wiring SWR1 and the third spiral wiring SWR3 is not particularly limited, and is, for example, substantially polygonal shape. The shape of each of the first spiral wiring SWR1 and the third spiral wiring SWR3 is, for example, substantially octagonal shape, substantially decagonal shape or substantially dodecagonal shape. The shape of the first spiral wiring SWR1 and the shape of the third spiral wiring SWR3 may be the same or different from each other.

A thickness of each of the first spiral wiring SWR1 and the third spiral wiring SWR3 is, for example, 0.5 nm or more and 5 nm or less. A material of each of the first spiral wiring SWR1 and the third spiral wiring SWR3 include, for example, copper (Cu) or aluminum (Al).

The second insulating layer IL2 is formed on the first insulating layer IL IL1 such that the second insulating layer IL2 covers the first inductor IND1. The second insulating layer IL2 may be a single layer or a multilayer. In present embodiment, the second insulating layer IL2 formed of three insulating layers. The number of layers constituting the second insulating layer IL 2 and the thickness of the second insulating layer IL 2 are appropriately adjusted in accordance with a withstand voltage between the first inductor IND1 and the second inductor IND2. For example, when the desired withstand voltage is 2000 V or more, the thickness of second insulating layer IL2 is preferably 1 μm or more and 10 μm or less. The second insulating layer IL2 is made of, for example, silicon oxide.

The second inductor IND2 is directly formed on the second insulating layer IL2. The second inductor IND2 is configured to be supplied with a potential greater than a potential supplied to the first inductor IND1. In present embodiment, it is electrically connected with the drive circuit DR driven by high voltage. The second inductor IND2 includes a second spiral wiring SWR2 and a fourth spiral wiring SWR4 electrically connected with each other.

An end part of the second spiral wiring SWR2 is electrically connected with an end part of the fourth spiral wiring SWR4. In present embodiment, the second spiral wiring SWR2 and the fourth spiral wiring SWR4 are integrally formed with each other as a single member. The second spiral wiring SWR2 and the fourth spiral wiring SWR4 is formed such that each of the second spiral wiring SWR2 and the fourth spiral wiring SWR4 is spirally wound in plan view. In plan view, a winding direction of the second spiral wiring SWR2 is opposite to a winding direction of the fourth spiral wiring SWR4. This allows the second inductor IND2 to operate by differential operation. The second spiral wiring SWR2 and the fourth spiral wiring SWR4 are aligned in the X direction.

The second spiral wiring SWR2 is formed directly on the second insulating layer IL 2 such that the second spiral wiring SWR2 faces the first spiral wiring SWR1. The fourth spiral wiring SWR4 is formed directly on the second insulating layer IL 2 such that the fourth spiral wiring SWR4 faces the third spiral wiring SWR3. This allows the second inductor IND2 to be magnetically coupled with the first inductor IND1. A signal can be transmitted between the first inductor IND1 and the second inductor IND2.

The shape of each of the second spiral wiring SWR2 and the fourth spiral wiring SWR4 is not particularly limited, and is, for example, a substantially circular shape or a substantially polygonal shape. The shape of each of the second spiral wiring SWR2 and the fourth spiral wiring SWR4 are, for example, substantially octagonal, substantially decagonal or substantially dodecagonal. In present embodiment, the shape of each of second spiral wiring SWR2 and the fourth spiral wiring SWR4 is a substantially octagonal shape. A thickness of each of the second spiral wiring SWR2 and the fourth spiral wiring SWR4 is, for example, 0.5 nm or more and 5 nm or less. A material of each of the second spiral wiring SWR2 and the fourth spiral wiring SWR4 include, for example, copper (Cu) or aluminum (Al). The shape, material, and thickness of the first inductor IND1 may be the same as or different from the shape, material, and thickness of the second inductor IND2.

The connecting wiring CWR electrically connect the second inductor IND2 and the center pad CPD with each other. The connecting wiring CWR is electrically connected with an end part of the second spiral wiring SWR2 and with an end part of the fourth spiral wiring SWR4. The connecting wiring CWR is directly formed on the second insulating layer IL2. The connecting wiring CWR is integrally formed with each of the second inductor IND2 and the center pad CPD as single member. The connecting wiring CWR is formed in the same layer as the second inductor IND2. The connecting wiring CWR is located between the second spiral wiring SWR2 and the fourth spiral wiring SWR4. The shape of connecting wiring CWR is not particularly limited as long as the above-mentioned function can be obtained. Example of thicknesses and material of the connecting wiring CWR is similar to the second spiral wiring SWR2.

The connecting wiring CWR is integrally formed with the center pad CPD as a single member at an end part of the connecting wiring CWR. A width of the end part of the connecting wiring CWR increases as it approaches the center pad CPD. This relieves the stresses occurring at a connection part of the connecting wiring CWR and the center pad CPD as compared to when a angle of the connection part of the connecting wiring CWR and the center pad CPD is right angle in plan view. As a result, it is possible to suppress the occurrence of cracks in the protective layer PL due to the stress. In other words, the end part of the connecting wiring CWR has a third side S3 connecting a first side S1 of the center pad CPD and a second side S2 of the connecting wiring CWR with each other. The third side S3 of the connecting wiring CWR, in a plan view, extends in a direction from one toward the other of the first side S1 and the second side S2. A part facing the third side S3 of the second spiral wiring SWR extends in the direction. A width of the connecting wiring CWR is a length of the connecting wiring CWR in the X direction.

The center pad CPD is an electrode pad electrically connected with the second inductor IND2. The center pad CPD is directly formed on the second insulating layer IL2. The center pad CPD is integrally formed with second inductor IND2 through the connecting wiring CWR as a single member. The center pad CPD is integrally formed with the connecting wiring CWR and the second inductor IND2 as a single member. The center pad CPD is formed in the same layer as the second inductor IND2. In plan view, a location of the center pad CPD is not particularly limited. In present embodiment, the center pad CPD is located at a center part between the second spiral wiring SWR2 and the fourth spiral wiring SWR4 in the X direction. In present embodiment, the center pad CPD is electrically connected with the second inductor IND2 through the connecting wiring CWR as a single member. The center pad CPD is electrically connected with the second inductor IND2 so that the center pad CPD is not located between the second spiral wiring SWR2 and the fourth spiral wiring in the X direction. In the Y direction, the center pad CPD is formed such that the is aligned with the second inductor IND2. This reduces a distance between the center pad CPD and the first inner pad IPD1, and a distance between the center pad CPD and the second inner pad IPD2 compared to when the center pad CPD is located between the second spiral wiring SWR2 and the fourth spiral wiring SWR4. Therefore, the wire bonding connection is facilitated, and as a consequence, a manufacturing of the semiconductor device SD1 is facilitated The size and shape of the center pad CPD are not particularly limited as long as the bonding wire can be connected with the center pad CPD. The shape of the center pad CPD is, for example, a substantially polygonal shape such as a substantially square shape and a substantially octagonal shape. In plan view, the shape of the center pad CPD, for example, may be the same as or different from an outward form of the second spiral wiring SWR2. In present embodiment, the shape of the center pad CPD is the same as the outward form of the second spiral wiring SWR2 and is generally octagonal. Thus, an electric field applied to the center pad CPD is relaxed, as a result, it is possible to suppress the occurrence of discharge.

The first inner pad IPD1 is an electrode pad electrically connected with the second spiral wiring SWR2. The first inner pad IPD1 is formed directly on the second insulating layer IL2. The first inner pad IPD1 is integrally formed with the second spiral wiring SWR2 at another end part of the second spiral wiring SWR2 as a single member. The first inner pad IPD1 is formed in the same layer as the second inductor IND2. In present embodiment, in plan view, the first inner pad IPD1 is formed in a region surrounded by the second spiral wiring SWR2.

The size and shape of the first inner pad IPD1 are not particularly limited as long as the bonding wire can be connected with the first inner pad IPD1. In plan view, the shape of the first inner pad IPD1, for example, may be the same as or different from the outward form of the second spiral wiring SWR2. In present embodiment, the shape of the first inner pad IPD1 is the same as the outward form of the second spiral wiring SWR2. Thus, it is possible to reduce a gap between the first inner pad IPD1 and the second spiral wiring SWR2, as a consequence, it is possible to increase the area efficiency. The shape of the first inner pad IPD1 is, for example, substantially polygonal shape such as substantially square shape and substantially octagonal shape. In present embodiment, the shape of the first inner pad IPD1 is generally octagonal shape. An example of the thickness and material of the first inner pad IPD1 is similar to that of the second spiral wiring SWR2.

The second inner pad IPD2 is an electrode pad electrically connected with the fourth spiral wiring SWR4. The second inner pad IPD2 is directly formed on the second insulating layer IL2. The second inner pad IPD2 is integrally formed with the fourth spiral wiring SWR4 at another end part of the fourth spiral wiring SWR4 as a single member. The second inner pad IPD2 is formed in the same layer as the second inductor IND2. In present embodiment, in plan view, the second inner pad IPD2 is formed in a region surrounded by the fourth spiral wiring SWR4.

The size and shape of the second inner pad IPD2 is not particularly limited as long as the bonding wire can be connected with the second inner pad IPD2. An example of shape, thickness and material of the second inner pad IPD2 is similar to that of the first inner pad IPD1.

The annular wiring AWR is directly formed on the second insulating layer IL2. The annular wiring AWR is electrically connected with the center pad CPD. In plan view, the annular wiring AWR is integrally formed with the center pad CPD as a single member. The annular wiring AWR is spaced from the second inductor IND2.

The annular wiring AWR surrounds the center pad CPD and the second inductor IND2 such that the annular wiring AWR without substantially forming a vertex in plan view. That is, the annular wiring AWRs are configured so as not to have a part where electric field concentration is likely to occur. Here, the "vertex" is an intersecting point of an angular part toward in plan view, the angular part formed by intersecting two sides. The annular wiring AWR can suppress concentration of an electric field in the second swirl wiring SWR2 and the fourth swirl wiring SWR4 even if each of the second spiral wiring SWR2 and the fourth spiral wiring SWR4 has a vertex.

In the first embodiment, the annular wiring AWR has a first part P1, a second part P2, a third part P3, a fourth part P4, a fifth part P5, a sixth part P6, a seventh part P7, and an eighth part P8.

The first part P1 and the second part P2 extend in the X direction. The second part P2 is located on an opposite side of the first part P1. The third part P3 and the fourth part P4 extend in the Y direction. The fourth part P4 is located on an opposite side of the third part P3. Each of shape of the first part P1, the second part P2, the third part P3, and the fourth part P4 is linear shape.

The fifth part P5 connects the first part P1 and the third part P3 with each other. The sixth part P6 connects the first part P1 and the fourth part P4 with each other. The seventh part P7 connects the second part P2 and the third part P3 with each other. The eighth part P8 connects the second part P2 and the fourth part P4 with each other. Each of the shape of the fifth part P 5, the sixth part P6, the seventh part P7, and the eighth part P8 is curved shape.

The annular wiring AWR may be spaced apart from the second inductor IND2. In plan view, the shortest distance between the annular wiring AWR and the second inductor IND2 are not particularly limited. From the viewpoint of miniaturization of the semiconductor device SD1, it is preferable that the shortest distance between the annular wiring AWR and the second inductor IND2 is smaller. For example, the shortest distance between the annular wiring AWR and the second inductor IND2 is preferably the same as the distance between two parts adjacent to each other of the second spiral wiring SWR2. An example of the thickness and material of the annular wiring AWR is similar to that of the second spiral wiring SWR2.

The electrode pad EPD is directly formed on the second insulating layer IL2. The electrode pad EPD is electrically connected with the semiconductor element (not shown). The location, number, and shape of the electrode pad EPD are not particularly limited. An example of the thickness and material of the electrode pad EPD is similar to that of the second spiral wiring SWR2. In plan view, the electrode pad EPD is preferably formed without located between the annular wiring AWR and a side closest to the annular wiring AWR among a plurality of sides constituting the semiconductor device SD1 (the semiconductor substrate SUB). Thus, abnormal discharge occurring between the electrode pad EPD and the annular wiring AWR can be suppressed.

The electrode pad EPD is preferably formed such that corner portions (the fifth part P5, the sixth part P6, the seventh part P7, and the eighth part P8) of the annular wiring AWR and a corner portions of the electrode pad EPD do not face each other. Preferably, each of the fifth part P5, the sixth part P6, the seventh part P7 and the eighth part P8 constituting the annular wiring AWR is not located on an extension line of a diagonal line of the electrode pad EPD formed nearest to the annular wiring AWR. Thus, it is possible to further suppress the abnormal discharge occurring between the electrode pad EPD and the annular wiring AWR.

The protective layer PL is directly formed on the second insulating layer IL2. The protective layer PL is an insulating layer for protecting the semiconductor device SD1 from external moisture and the like. The protective layer PL is formed on the second insulating layer IL2 such that the protective layer PL covers the second inductor IND2, the connecting wiring CWR, and the annular wiring AWR. A pad opening POP is formed on protective layer PL such that the pad opening POP exposes a part of each of the center pad CPD, the first inner pad IPD1, the second inner pad IPD2, and the electrode pad EPD from the protective layer PL. A wiring, such as a bonding wire, is connected with each of the center pad CPD, the first inner pad IPD1, the second inner pad IPD2, and the electrode pad EPD through the pad opening POP. The protective layer PL is, for example, one or both of a silicon oxide film and a silicon nitride film.

(Method of Manufacturing Semiconductor Device)

Next, an exemplary method of manufacturing the semiconductor device SD1 according to the first embodiment will be described. For example, a method of manufacturing the semiconductor device SD1 according to the first embodiment includes (1) providing the semiconductor substrate SUB, (2) forming the wiring layer WL, and (3) forming the protective layer PL.

(1) Providing the Semiconductor Substrate SUB

The semiconductor substrate SUB is provided. For example, off-the-shelf products may be purchased. The semiconductor element may be formed on the semiconductor substrate SUB.

(2) Forming the Wiring Layer WL

Subsequently, the wiring layer WL is formed on the semiconductor substrate SUB. The forming the wiring layer WL includes, for example, forming the first insulating layer IL1, forming the first inductor IND1, forming the second insulating layer IL2, and forming the second inductor IND2, the center pad CPD, the first inner pad IPD1, the second inner pad IPD2, and the electrode pad EPD.

The wiring layer WL may be formed by a known method as a method of forming multilayer wiring layer. A method of the forming the first insulating layer IL1 and the second insulating layer IL2 are, for example, CVD method. Each of the first inductor IND1, the second inductor IND2, the center pad CPD, the first inner pad IPD1, the second inner pad IPD2 and the electrode pad EPD is formed by forming a conductive film by a sputtering method, and then patterning the conductive film to a desired shape.

(3) Forming the Protective Layer PL

Subsequently, the protective layer PL is formed on the wiring layer WL. A method of forming the protective layer PL is, for example, CVD method. A plurality of pad openings POP are formed on the protective layer PL at location corresponding to each of the center pad CPD, the first inner pad IPD1, the second inner pad IPD2, and the electrode pad EPD. A method of forming the pad openings POP are, for example, photolithography method and etching method.

By the above manufacturing method, the semiconductor device SD1 according to the first embodiment can be manufactured.

(Effect)

In the semiconductor device SD1 according to the first embodiment, in plan view, the annular wiring AWR surrounds the second inductor IND2 and the center pad CPD without having a vertex. Thus, even if each of the second inductor IND2 and the center pad CPD has a part (vertex) where the electric field concentration is likely to occur, abnormal discharge starting from the vertex can be suppressed.

[First Modification]

Figure 6:
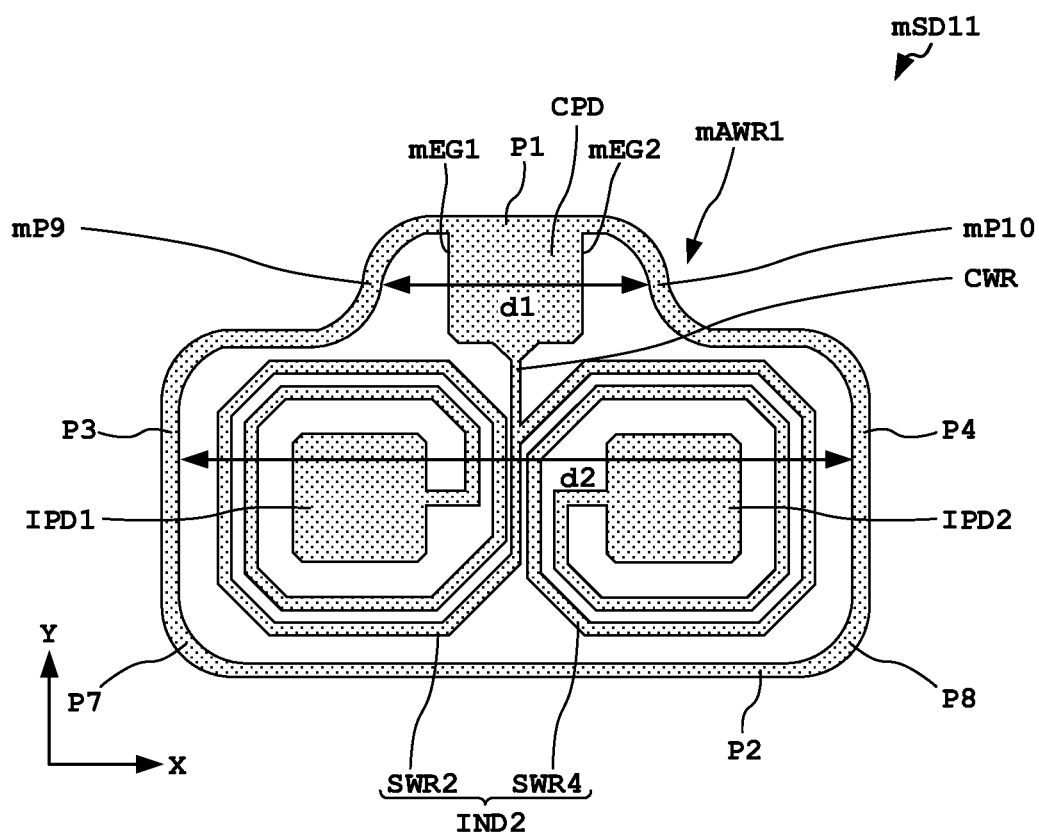
FIG. 6 is a partially enlarged plan view illustrating an exemplary configuration of a main portion of a semiconductor device according to a first modification of the first embodiment.

FIG. 6 is a partial enlarged plan view illustrating an exemplary configuration of a main portion of a semiconductor device mSD11 according to a first modification of the first embodiment.

A semiconductor device mSD11 includes an annular wiring mAWR1. The annular wiring mAWR1 has a ninth part mP9 and a tenth part mP10 which recessedly extend toward the second inductor IND2. The ninth part mP9 connects the first part P1 and the third part P3 with each other. The tenth part mP10 connects the first part P1 and the fourth part P4 with each other.

In plan view, the center pad CPD has a first outer edge mEG1 and a second outer edge mEG2 extending in the Y direction. The second outer edge mEG2 is located on an opposite side of the first outer edge mEG1.

The annular wiring mAWR1 includes the first part P1, the second part P2, the ninth part mP9, the tenth part mP10, the third part P3 and the fourth part P4. The ninth part mP9 faces the first outer edge mEG1 of the center pad CPD in the X direction. The tenth part mP10, in the X direction, faces the second outer edge mEG2 of the center pad CPD. The third part P3 faces the second spiral wiring SWR2 in the X direction. The fourth part P4 faces the fourth spiral wiring SWR4 in the X direction.

In first modification, the annular wiring mAWR1 is formed such that, in the X direction, a distance d1 of the ninth part mP9 and the tenth part mP10 is smaller than a distance d2 of the third part P3 and the fourth part P4. Thus, in a plan view, it is possible to reduce a region surrounded by the annular wiring mAWR1. Consequently, the semiconductor device mSD11 can be more miniaturized.

[Second Modification]

Figure 7:
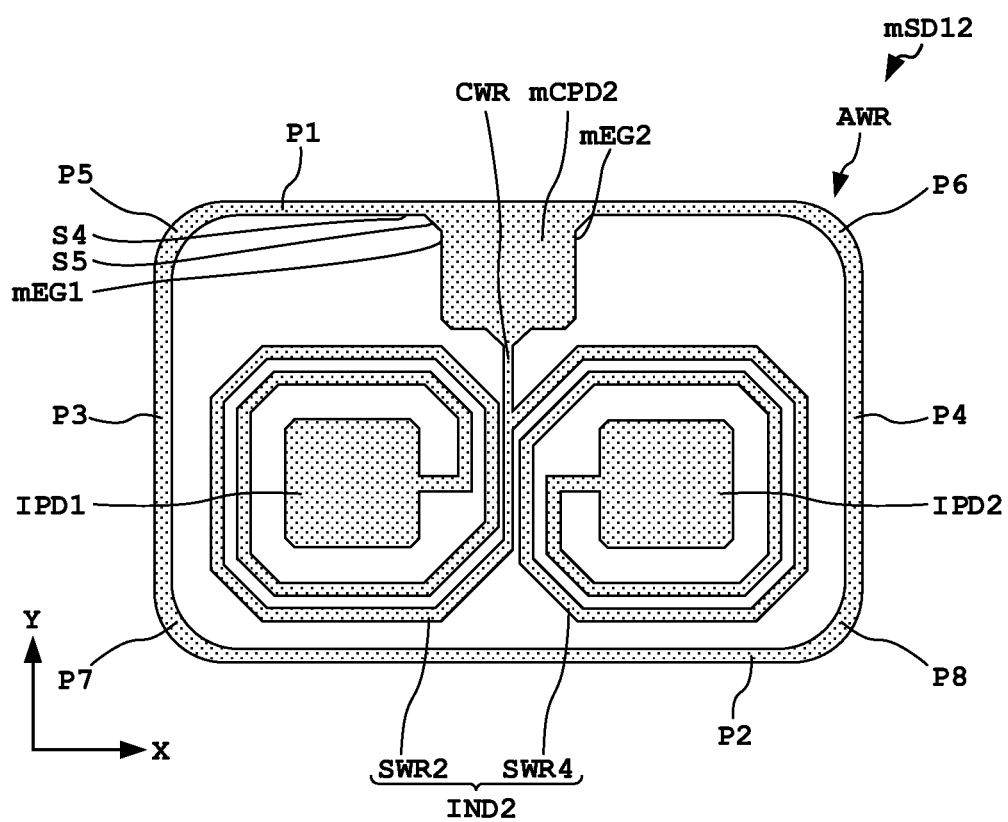
FIG. 7 is a partial enlarged plan view illustrating an exemplary configuration of a main portion of a semiconductor device according to a second modified example of the first embodiment.

FIG. 7 is a partial enlarged plan view illustrating an exemplary configuration of a main portion of a semiconductor device mSD12 according to a second modification of the first embodiment.

In the semiconductor device mSD12, a center pad mCPD2 is integrally formed with the annular wiring AWR at an end part of a center pad mCPD2 as a single member. A width of the end part of the center pad mCPD2 increases as it approaches the annular wiring AWR. The end part of the center pad mCPD2 has a fifth side S5 connecting the first outer edge EDG1 of the center pad mCPD2 and the fourth side S4 of the annular wiring AWR with each other. The fifth side S5 of the center pad mCPD2 extends from one of the first outer edge EDG1 and the fourth side S4 toward the other in plan view. A width of the center pad mCPD2 is a length of the center pad mCPD2 in the X direction.

In the second modification, the width of the end part of the center pad mCPD2 increases as it approaches the annular wiring AWR. Thus, in plan view, it is possible to alleviate the stress caused at a connection part of the center pad mCPD2 and the annular wiring AWR as compared with an angle of the connection part is right angle. The occurrence of cracks in the protective layer PL due to the stress can be suppressed. Consequently, the reliability of the semiconductor device mSD2 can be further improved.

[Third Modification]

Figure 8:
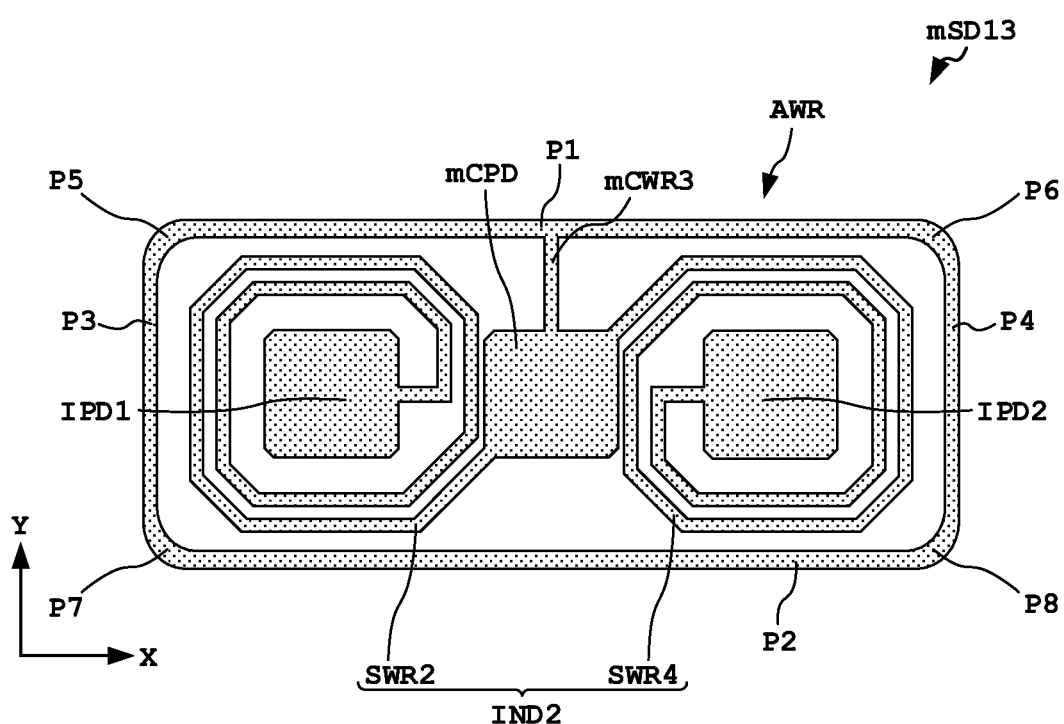
FIG. 8 is a partially enlarged plan view illustrating an exemplary configuration of a main portion of a semiconductor device according to a third modified example of the first embodiment.

FIG. 8 is a partially enlarged plan view illustrating an exemplary configuration of a main portion of a semiconductor device mSD13 according to a third modification of the first embodiment.

A semiconductor device mSD13 includes a center pad mCPD formed between the second spiral wiring SWR2 and the fourth spiral wiring SWR4 in plan view. The center pad mCPD is connected with the annular wiring AWR through a connecting wiring mCWR. In the third modification, the center pad mCPD is formed between the second spiral wiring SWR2 and the fourth spiral wiring SWR4. Therefore, in a plan view, it is possible to reduce an area surrounded by the annular wiring AWR. As a result, the semiconductor device mSD13 can be made smaller.

[Fourth Modification]

Figure 9:
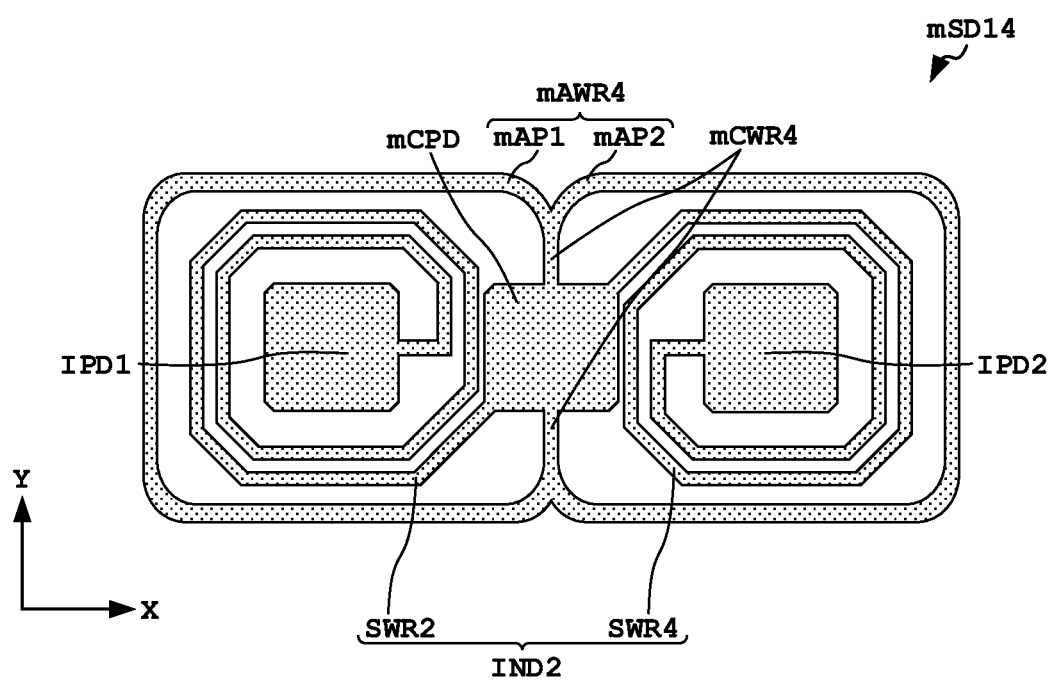
FIG. 9 is a partially enlarged plan view illustrating an exemplary configuration of a main portion of a semiconductor device according to a fourth modified example of the first embodiment.

FIG. 9 is a partially enlarged plan view illustrating an exemplary configuration of a main portion of a semiconductor device mSD14 according to a fourth modification of the first embodiment.

In the semiconductor device mSD14, an annular wiring mAWR4 includes a first annular portion mAP1 and a second annular portion mAP2. The first annular portion mAP1 and the second annular portion mAP2 are electrically connected with each other through a connecting wiring mCWR4 and the center pad mCPD. The first annular portion mAP1, in plan view, surrounds the second spiral wiring SWR2. The second annular portion mAP2 surrounds the fourth spiral wiring SWR4 in plan view. In the fourth modification, the first annular portion mAP1 and the second annular portion mAP2 are connected with the center pad mCPD from both sides of the center pad mCPD in the Y direction. Thus, even if each of a resistance of the first annular portion mAP1 and a resistance of the second annular portion mAP2 is large, the second inductor IND2 and the annular wiring mAWR4 can be fixed at the same potential with each other.

The annular wiring mAWR4 has an intersecting point formed at a connection part of the first annular portion mAP1 and the second annular portion mAP2. However, the intersecting point is not angular toward. Thus, the concentration of the electric field does not occur at the intersecting point. Therefore, in the fourth modification, the abnormal discharge is suppressed.

Second Embodiment

A semiconductor module SM2 and a semiconductor device SD2 according to a second embodiment is different from the semiconductor device SD1 according to the first embodiment in that the semiconductor device SD2 does not include the cyclic wiring AWR, and in a configuration of a center pad CPD2 differs. Hereinafter, the same components as those of the semiconductor device SD1 according to the first embodiment are denoted by the same reference numerals, and descriptions thereof are omitted.

Figure 10:
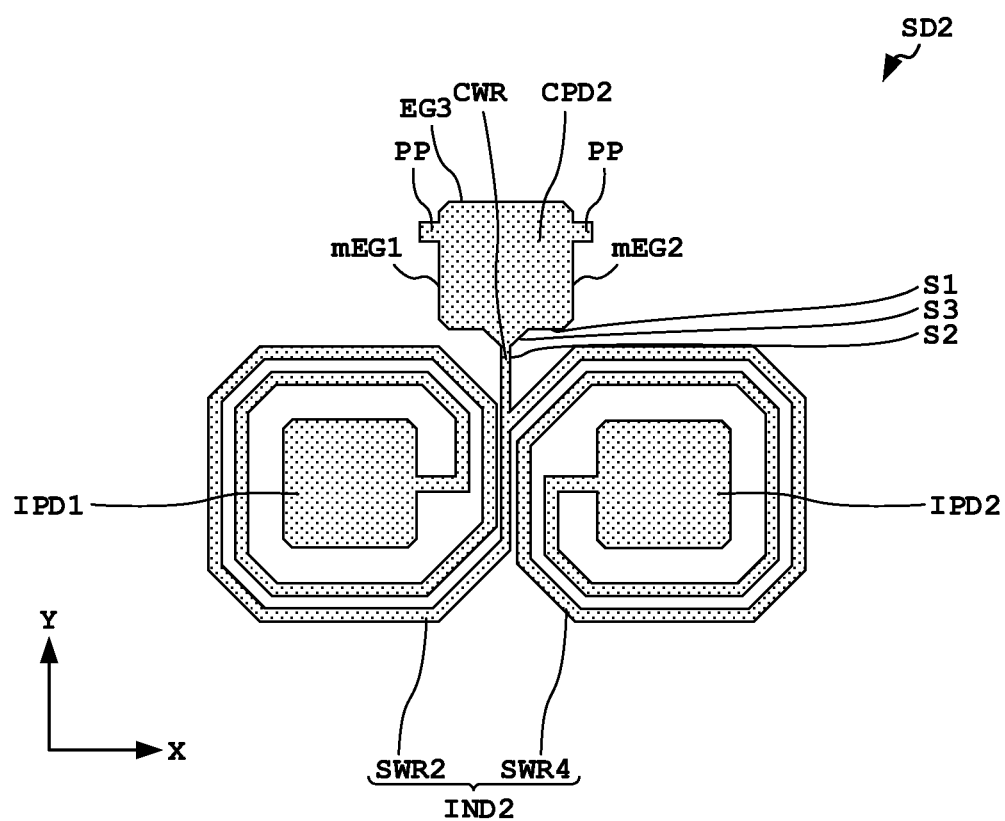
FIG. 10 is a partially enlarged plan view illustrating an exemplary configuration of a main portion of a semiconductor device according to a second embodiment.

FIG. 1 is a block diagram showing an exemplary configuration of the semiconductor module SM2 according to the second embodiment. FIG. 10 is a partially enlarged plan view illustrating an exemplary configuration of a main portion of the semiconductor device SD2.

As shown in FIG. 1, the semiconductor module SM2 includes a semiconductor device SD2, an inverter INV, and a load LD. The semiconductor device SD 2 includes a semiconductor substrate SUB, a first insulating layer IL1, a first inductor IND1, a second insulating layer IL2, a second inductor IND2, a connecting wiring CWR, a center pad CPD2, a first inner pad IPD1, an second inner pad IPD2, and an electrode pad EPD, and a protective layer PL.

As shown in FIG. 10, the center pad CPD2 has a first side S1, a first outer edge EDG1, a second outer edge EDG2, and a third outer edge EDG3. The first side S1 and the third outer edge EDG3 are located on opposite side with each other. The first outer edge EDG1 and the second outer edge EDG2 are located on opposite side with each other.

The center pad CPD2 includes two protruding portions PP. In plan view, the protruding portion PP is formed such that the protruding portion PP protrudes from the center pad CPD2. In the second embodiment, the two protruding portions PP project from the first outer edge EDG1 and the second outer edge EDG2, respectively, in the X direction.

The number of the protruding portions PP is not particularly limited, and is preferably large. As a result, the number of vertexes of the center pad CPD2 increases, and a magnitude of an electric field concentrated on each vertex can be reduced. In the second embodiment, the number of protruding portions PP is two.

The protruding portion PP may protrude from the third outer edge EDG3 in the Y direction. The center pad CPD2 may include three protruding portions PP protruding from the first outer edge EDG1, the second outer edge EDG2 and the third outer edge EDG3, respectively.

A shape of the protruding portion PP is not particularly limited as long as the protruding portion PP can reduce an intensity of the electric field concentrated on the vertex in the center pad CPD2. For example, the protruding portion PP has, for example, a substantially polygonal shape. The protruding portion PP may have a rectangular shape or a substantially trapezoidal shape.

It is preferable that a location of the protruding portion PP is closer to the third outer edge EDG3 than the first side S1 in the Y direction. Thus, the protruding portion PP can effectively suppress the electric field concentration occurring on the first side S1 side in the center pad CPD2.

[Simulation]

Figure 11:
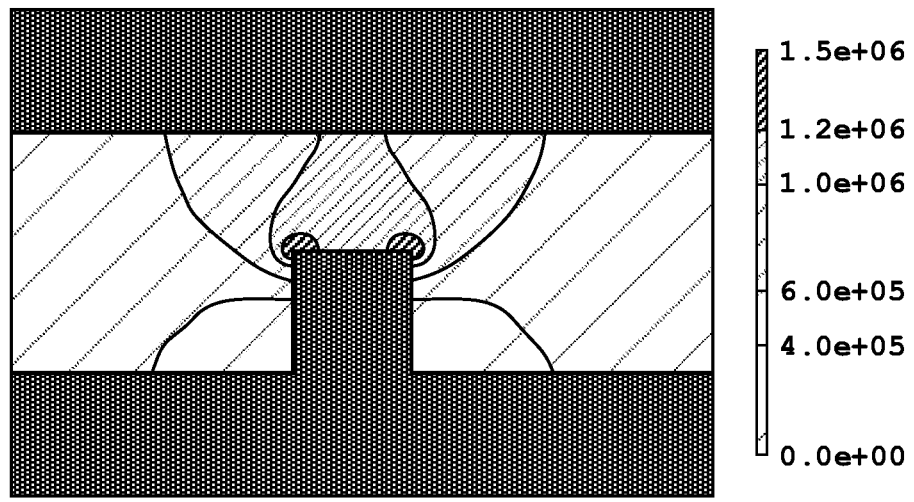
FIG. 11 is a result of field distribution simulation when a center pad has no protruding portion.
Figure 12:
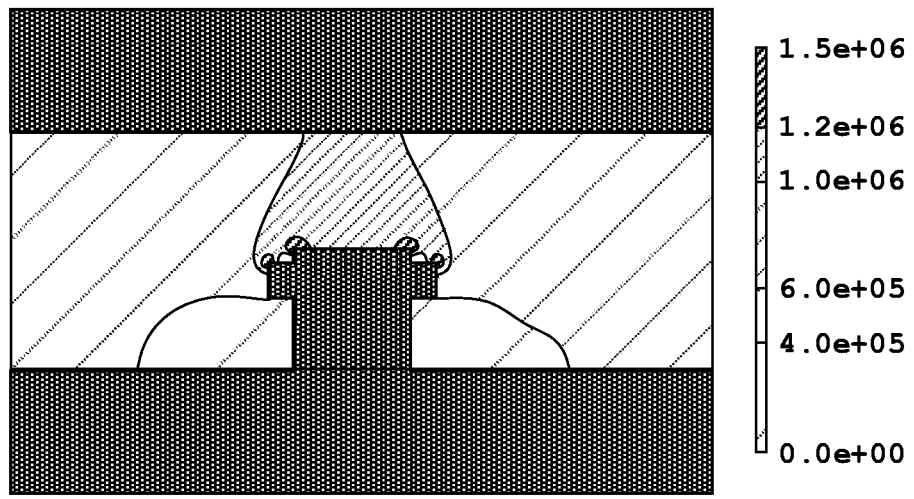
FIG. 12 is a result of field distribution simulation when the center pad has a protruding portion.

In order to investigate an effect of the protruding portion PP, a simulation was carried out. In this simulation, the distribution of the electric field was calculated in a pattern including a portion corresponding to the protruding portion PP of the center pad CPD2 and a pattern having no portion corresponding to the protruding portion PP. FIG. 11 is a result of field distribution simulation when the center pad CPD2 has no protruding portion PP. FIG. 12 is a result of field distribution simulation when the center pad CPD2 has a protruding portion PP. In FIGS. 11 and 12, a darker part of the hatching shows that the electric field intensity is larger.

As is clear from FIG. 11, a strong electric field concentration has occurred at the corners of the pattern in the pattern having no portion corresponding to the protruding portion PP of the center pad CPD2. In contrast, as is clear from FIG. 12, it can be seen that the electric field is dispersed on the portion corresponding to the protruding portion PP of the center pad CPD2, and that the electric field strength at the corner is reduced in the pattern having the portion corresponding to the protruding portion PP of the center pad CPD2. Thus, the center pad CPD2 having the protruding portion PP is effective from the viewpoint of reducing the magnitude of electric field concentration. Thus, abnormal discharging starting from the center pad CPD2 can be suppressed.

[Effect]

The center pad CPD2 of the semiconductor device SD2 according to the second embodiment includes the protruding portion PP. In the center pad CPD2, it is possible to increase the number of vertexes on which the electric field tends to concentrate. Thus, abnormal discharging starting from the center pad CPD2 can be suppressed. As a result, the reliability of the semiconductor device SD2 can be improved.

Third Embodiment

The semiconductor module SM3 and the semiconductor module semiconductor device SD3 according to a third embodiment are different from the semiconductor device SD1 according to the first embodiment in that shape of the first inductor IND1 and the second inductor IND2 are different from each other. Hereinafter, the same components as those of the semiconductor device SD1 according to the first embodiment are denoted by the same reference numerals, and descriptions thereof are omitted.

Figure 13:
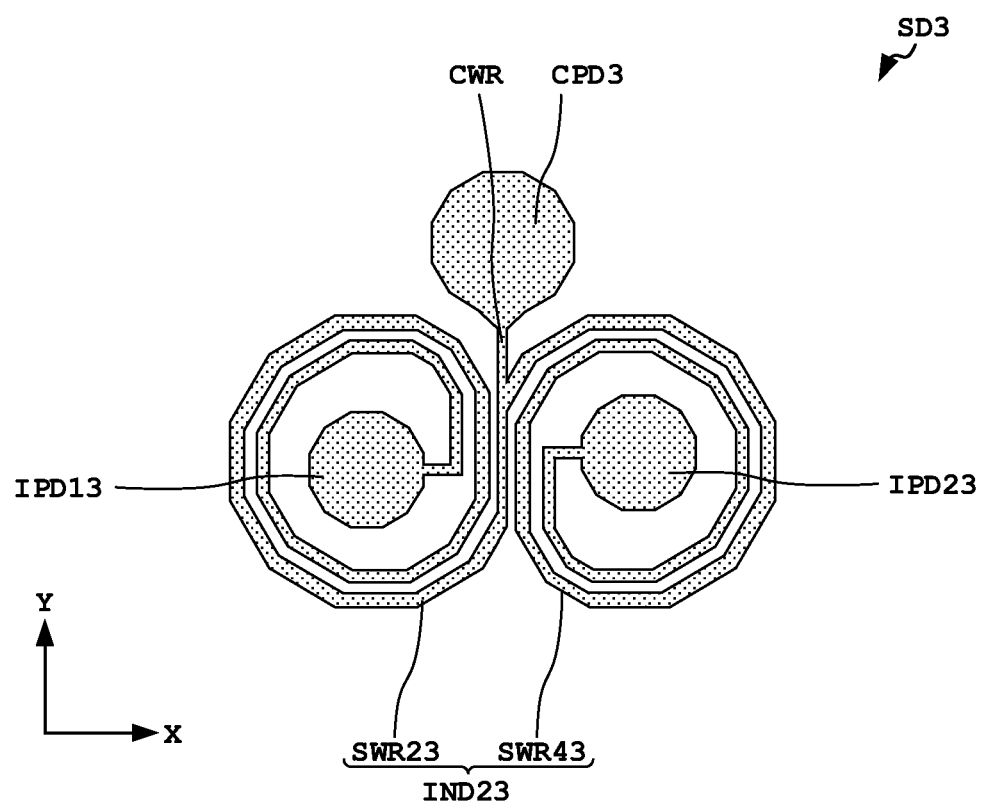
FIG. 13 is a partially enlarged plan view illustrating an exemplary configuration of a main portion of a semiconductor device according to a third embodiment.
Figure 14:
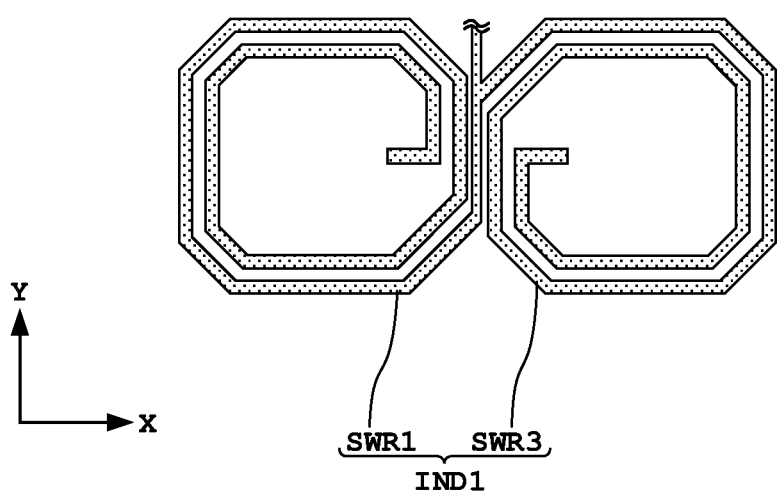
FIG. 14 is an plan view illustrating an exemplary shape of a first inductor in plan view.

FIG. 1 is a block diagram showing an exemplary configuration of a semiconductor module SM3 according to a third embodiment. FIG. 13 is a partial enlarged plan view illustrating an exemplary configuration of a main portion of the semiconductor device SD3 according to the third embodiment. FIG. 14 is a plan view illustrating an exemplary figure of a first inductor IND1 according to the third embodiment in plan view.

As shown in FIG. 1, the semiconductor module SM3 includes a semiconductor device SD3, an inverter INV, and a load LD. The semiconductor device SD3 includes a semiconductor substrate SUB, a first insulating layer IL1, a first inductor IND1, a second insulating layer IL2, a second inductor IND23, a connecting wiring CWR, a center pad CPD3, a first inner pad IPD13, a second inner pad IPD23, an electrode pad EPD, and a protective layer PL.

The second inductor IND23 is similar to the second inductor IND2 according to the first embodiment except for the respective shapes of a second spiral wiring SWR23 and a fourth spiral wiring SWR43. In the third embodiment, the number of vertexes of each of the second spiral wiring SWR23 and the fourth spiral wiring SWR43 is greater than the number of vertexes of each of the first spiral wiring SWR1 and the third spiral wiring SWR3. A shape of each of the second spiral wiring SWR23 and the fourth spiral wiring SWR43 is a substantially circular shape. The number of vertexes of the second spiral wiring SWR23 may be greater than the number of vertexes of the first spiral wiring SWR1, and the fourth spiral wiring SWR43 may have a substantially circular shape.

In present embodiment, the shape of each of the second spiral wiring SWR23 and the fourth spiral wiring SWR43 is a substantially polygonal shape. For example, when the shape of each of the first spiral wiring SWR1 and the third spiral wiring SWR3 is substantially octagonal shape, the shape of each of the second spiral wiring SWR23 and the fourth spiral wiring SWR43 is substantially decagonal shape and substantially icosagonal shape, and the like. As a result, in the second inductor IND2 to which higher voltages are applied, the magnitude of the electric field concentrated on a vertex of each of the second spiral wiring SWR23 and the fourth spiral wiring SWR43 can be reduced. Consequently, it is possible to suppress the generation of abnormal discharge caused by the second inductor IND2 as a starting point.

When each of the first spiral wiring SWR1 and the third spiral wiring SWR3 has a substantially octagonal shape, the first inductor IND1 includes a part extending in the X direction, a part extending in the Y direction, and a part extending in a direction inclined by approximately 45° with respect to each of the X direction and the Y direction. In this case, the shape of the first inductor IND1 is preferable from the viewpoint of ease of designing.

In plan view, the second inductor IND2 faces the first inductor IND1 so that the vertex of the second spiral wiring SWR23 does not overlap the vertex of the first spiral wiring SWR1. The same applies to the fourth spiral wiring SWR43 and the third spiral wiring SWR3. Thus, it is possible to suppress the occurrence of abnormal discharge occurring between the first inductor IND1 and the second inductor IND23.

The center pad CPD3, the first inner pad IPD13, and the second inner pad IPD23 are the same as the center pad CPD, the first inner pad IPD1, and the second inner pad IPD2 according to the first embodiment, respectively, except for their shapes. In plan view, the shape of each of the center pad CPD3, the first inner pad IPD13 and the second inner pad IPD23 is generally dodecagonal shape. Compared with the case where the shape of the center pad CPD3 is substantially octagonal shape, by the shape of the center pad CPD3 is substantially dodecagonal shape, it is possible to further suppress the occurrence of abnormal discharges starting from the center pad CPD3.

[Simulation]

Figure 15:
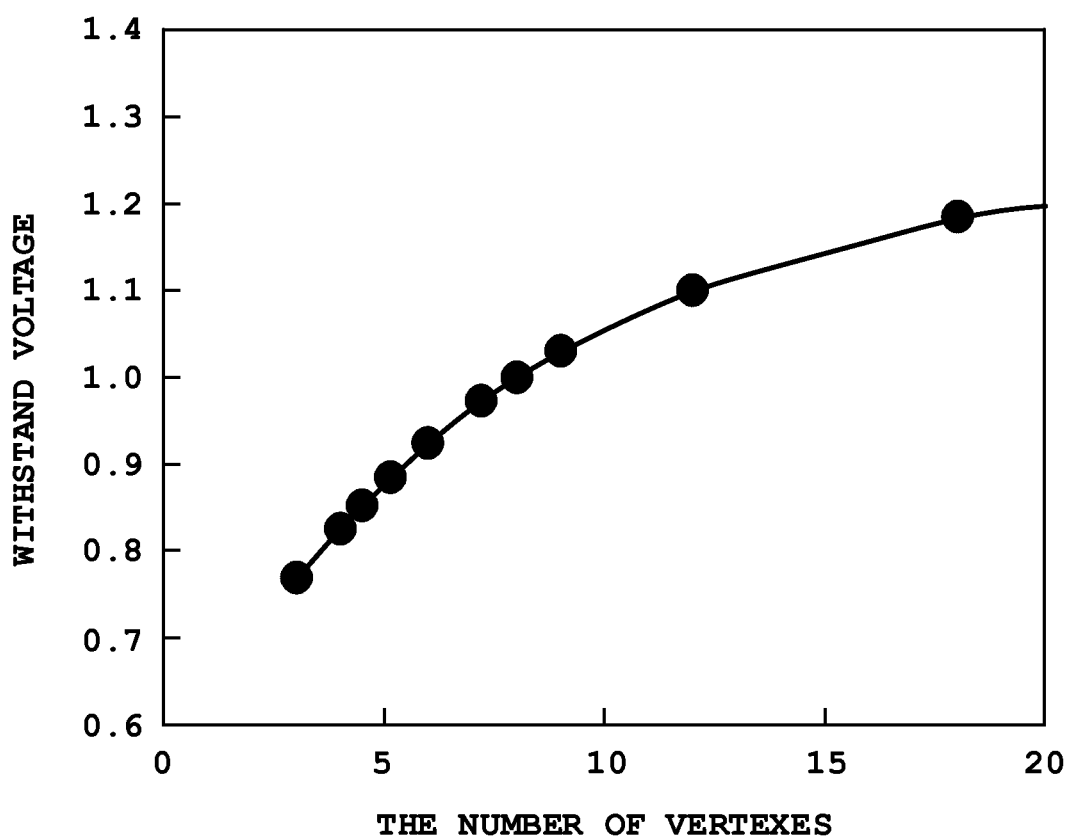
FIG. 15 is a graph showing relationship between a shape of a second spiral wiring and a withstand voltage of the semiconductor device.

A simulation was performed in order to investigate a relationship between the shape of the second spiral wiring SWR23 and the withstand voltage of the semiconductor device SD3. FIG. 15 is a graph showing the relationship between the shape of the second spiral wiring SWR23 and the withstand voltage of the semiconductor device SD3. In FIG. 15, a horizontal axis indicates the number of vertexes of the second spiral wiring SWR23, and a vertical axis indicates a magnitude of a withstand voltage of the semiconductor device SD3. For example, when the number of vertexes of the second spiral wiring SWR23 is 8, the shape of the second spiral wiring SWR23 is substantially octagonal shape in plan view. The withstand voltage is based on when the number of vertexes of the second spiral wiring SWR2 is 8. Here, the withstand voltage is a voltage at which the electric field on the corner of the second spiral wiring SWR2 becomes 10 MV/cm.

As is clear from FIG. 15, as the number of vertexes of the second spiral wiring SWR23 increases, the withstand voltage of the semiconductor device SD3 increases. For example, when the shape of the second spiral wiring SWR23 is substantially octagonal shape or substantially icosagonal shape, the withstand voltage is improved by about 20% as compared with the case where the shape of the second spiral wiring SWR23 is substantially octagonal shape. This is considered to be because as the number of vertexes of the second spiral wiring SWR23 increases, the magnitude of the electric field concentrated on the vertex of the second spiral wiring SWR23 decreases in the second inductor IND2.

[Effect]

The third embodiment has the same effects as the second embodiment.

[Modification]

Figure 16:
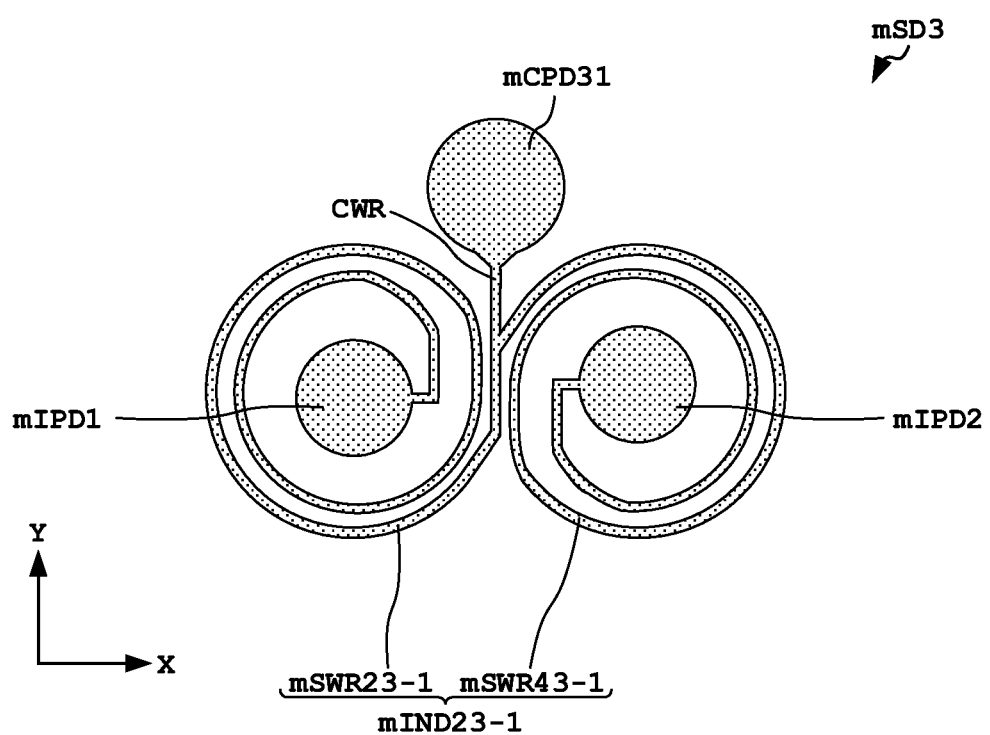
FIG. 16 is a partially enlarged plan view illustrating an exemplary configuration of a main portion of a semiconductor device according to a modification of the third embodiment.

FIG. 16 is a partially enlarged plan view illustrating an exemplary configuration of a main portion of a semiconductor device mSD3 according to a modification of the third embodiment.

A second inductor mIND23-1 of the semiconductor device mSD3 includes a second spiral wiring mSWR23-1 and a fourth spiral wiring mSWR43-1. A shape of each of the second spiral wiring mSWR23-1 and the fourth spiral wiring mSWR43-1, in plan view, is substantially circular shape. Thus, it is possible to further suppress the generation of abnormal discharges caused by the second inductor IND23-1 as a starting point. Consequently, the reliability of the semiconductor device mSD3 can be further improved.

The shape of the center pad mCPD31, in plan view, is substantially circular shape. Thus, as a result that can further suppress the generation of abnormal discharge caused by the center pad mCPD31 as a starting point, it is possible to further improve the reliability of the semiconductor device mSD3.

The shape of each of the first inner pad mIPD1 and the second inner pad mIPD2 is preferably the same as an outward form of each of the second spiral wiring mSWR23-1 and the fourth spiral wiring mSWR43-1 in plan view. The shape of each of the first inner pad mIPD1 and the second inner pad mIPD2 are preferably the same as the shape of the center pad mCPD31 in plan view. Thus, a gap between the first inner pad mIPD1 and the second spiral wiring mSWR23-1 and a gap between the second inner pad mIPD2 and the fourth spiral wiring mSWR43-1 can be reduced, as a consequence, it is possible to increase the area efficiency. In the modification, the shape of each of the first inner pad mIPD1 and the second inner pad mIPD2 is substantially circular shape in plan view.

It should be noted that the present invention is not limited to the above-mentioned embodiments, and various modifications can be made without departing from the gist thereof. For example, the first inductor IND1 may include the first spiral wiring SWR1 and may not include the third spiral wiring SWR3. The second inductor IND2 may the second spiral wiring SWR2 and may not the fourth spiral wiring SWR4.

The annular wiring AWR may not the third part P3 and the fourth part P4. In this case, the shape of the annular wiring AWR, in plan view, is an oval shape. The annular wiring AWR needs only be electrically connected with the second inductor IND2 and may not be fully closed. That is, the annular wiring AWR may include parts that are spaced apart from each other.

In addition, even when a specific numerical value example is described, it may be a numerical value exceeding the specific numerical value, or may be a numerical value less than the specific numerical value, except when it is theoretically obviously limited to the numerical value. In addition, the component means "B including A as a main component" or the like, and the mode including other components is not excluded.

Also, a part of each embodiment and each modification may be combined with each other.

What is claimed is:

1. A semiconductor device comprising:
  a semiconductor substrate;
  a first insulating layer formed on the semiconductor substrate;
  a first inductor directly formed on the first insulating layer;
  a second insulating layer formed on the first insulating layer such that the second insulating layer covers the first inductor;
  a second inductor directly formed on the second insulating layer such that the second inductor faces the first inductor;
  a pad directly formed on the second insulating layer, the pad electrically connected with the second inductor; and
  an annular wiring electrically connected with the pad, the annular wiring spaced apart from the second inductor,
  wherein, in plan view, the annular wiring surrounds the second inductor without forming a vertex,
  wherein the first inductor includes a first spiral wiring,
  wherein the second inductor includes a second spiral wiring facing the first spiral wiring,
  wherein, in plan view, a shape of each of the first spiral wiring and the second spiral wiring is substantially polygonal shape,
  wherein the first inductor includes a third spiral wiring electrically connected with the first spiral wiring,
  wherein the second inductor includes a fourth spiral wiring facing the third spiral wiring, the fourth spiral wiring electrically connected with the second spiral wiring,
  wherein the semiconductor device comprises a connecting wiring directly formed on the second insulating layer, the connecting wiring formed between the second spiral wiring and the fourth spiral wiring,
  wherein the pad is electrically connected with the second inductor through the connecting wiring without being located between the second spiral wiring and the fourth spiral wiring in plan view,
  wherein, in plan view, the second spiral wiring and the fourth spiral wiring are aligned in a first direction, and
  wherein the annular wiring includes:
    a first part extending in the first direction, the first part having a linear shape;
    a second part located on an opposite side of the first part, the second part extending in the first direction, the second part having a linear shape;
    a third part extending in a second direction perpendicular to the first direction in plan view, the third part having a linear shape;

a fourth part located on an opposite side of the third part, the fourth part extending in the second direction, the fourth part having a linear shape;

a fifth part connecting the first part and the third part with each other;

a sixth part connecting the first part and the fourth part with each other;

a seventh part connecting the second part and the third part with each other; and an eighth part connecting the second part and the fourth part with each other.

2. The semiconductor device according to claim 1, wherein the connecting wiring is integrally formed with the pad at an end part of the connecting wiring with a single member, and wherein a width of the end part of the connecting wiring increases toward the pad.

3. The semiconductor device according to claim 2, wherein the end part of the connecting wiring has a third side connecting a first side of the pad and a second side of the connecting wiring with each other, wherein, in plan view, the third side extends in a first direction from one of the first side and the second side toward the other, and wherein a part of the second spiral wiring, the part facing the third side, extends in the first direction.

4. The semiconductor device according to claim 1, wherein the second inductor is configured to be supplied with a potential greater than a potential supplied to the first inductor.

* * * * *